United States Patent [19]
Kawakyu et al.

[11] Patent Number: 6,118,985
[45] Date of Patent: Sep. 12, 2000

[54] HIGH FREQUENCY SWITCH DEVICE, FRONT END UNIT AND TRANSCEIVER

[75] Inventors: Katsue Kawakyu, Kawasaki; Masami Nagaoka, Ebina; Atsushi Kameyama, Ota-ku, all of Japan

[73] Assignee: Kabushiki Kaisha Toshiba, Kawasaki, Japan

[21] Appl. No.: 09/121,939

[22] Filed: Jul. 24, 1998

[30] Foreign Application Priority Data

Jul. 25, 1997 [JP] Japan ..................................... 9-200446

[51] Int. Cl.$^7$ ....................................................... H04B 1/44
[52] U.S. Cl. ................................ 455/78; 455/82; 455/83; 333/103
[58] Field of Search ................................. 455/78, 82, 83, 455/79, 80, 81; 333/103, 104; 327/404

[56] References Cited

U.S. PATENT DOCUMENTS 5,748,053  5/1998  Kameyama et al. ..................... 333/103
5,878,331  3/1999  Yamamoto et al. ........................ 455/83

FOREIGN PATENT DOCUMENTS 9-8501    1/1997  Japan .
9-153781  6/1997  Japan .

*Primary Examiner*—Lee Nguyen
*Attorney, Agent, or Firm*—Finnegan, Henderson, Farabow, Garrett & Dunner, L.L.P.

[57] ABSTRACT

In order to minimize the chip area and improve the linear characteristics obtained when large signals are inputted, a high frequency switch device comprises first, second and third terminals (3, 4, 6); a first circuit composed of a first FET (11), and a first inductor (21) and a first capacitor (25) both connected with the first FET (11) in parallel to each other, one end of the first circuit being connected to the first terminal (3); and a second circuit composed of a second FET (12), and a second inductor (22) and a second capacitor (26) both connected with the second FET (12) in parallel to each other, one end of the second circuit being connected to the first circuit and the other end of the second circuit being connected to the second terminal (4). Further, the high frequency switch device is characterized in that a first control signal is applied to a gate of the first FET (11) via a resistance (31); a second control signal is applied to a gate of the second FET (12) via a resistance (33); the third terminal (6) is connected to a common junction point of the first and second circuits; and a predetermined potential is applied to the common junction point.

20 Claims, 8 Drawing Sheets

HIGH FREQUENCY SWITCH DEVICE, FRONT END UNIT AND TRANSCEIVER

BACKGROUND OF THE INVENTION

1. Field of the Invention

The present invention relates to a high frequency switch device, front end unit and transceiver, and more specifically to a high frequency switch device, front end unit and transceiver, for switching an input path of RF (radio frequency) signals to an output path thereof or vice versa in transmission or reception mode of an RF trans-mitter/receiver.

2. Description of the Background Art

Recently, a single pole dual through (SPDT) switch device composed of four FETs 11, 12, 13 and 14, as shown in FIG. 10, has been widely adopted as a high frequency switch device used for a mobile communication system. In this case, a signal input/output terminal 2 is used as an antenna terminal; a signal input/output terminal 3 is used as a transmit-side terminal Tx of a transmit-side power transmission path; and a signal input/output terminal 4 is used as a receive-side terminal Rx of a receive-side small-signal transmission path, under consideration of a switch for switching an antenna of a digital cordless telephone from transmission state to reception state or vice versa.

The operation of the SPDT switch device as shown in FIG. 10 will be explained in more detail hereinbelow. When 0 V is given to a gate signal input terminal 5 and further—2.7 V is given to a gate signal input terminal 7, since the two FETs 11 and 14 are both turned on, the two FETs 12 and 13 are both turned off. Here, when a high frequency signal is inputted through the transmit-side terminal (Tx) 3, the inputted signal is outputted from the antennal signal terminal (Ant) 2 through the FET 11. In this case, a signal obtained by reducing various losses from the signal inputted through the transmit-side terminal 3 is outputted through the antenna terminal 2. Here, the various losses are an on-resistance loss of the FET 11, a leakage loss through a source-drain capacitance $C_{off}$ obtained when the FET 13 is turned off, and a leakage loss through a source-drain capacitance $C_{off}$ obtained when the off-side FET 12 is turned off.

On the other hand, although a leak current flows between the transmit-side terminal 3 (on the off-side) and the receive-side terminal 4 through the source-drain capacitance $C_{off}$ obtained when the FET 12 is turned off, since this leak current flows to ground through the on-state FET 14, a high isolation status can be obtained between both the transmit-side terminals 3 and the receive-side terminal 4, so that it is possible to prevent the communication system from deteriorating due to a leakage of signals from the transmit-side terminal 3 to the receive-side terminal 4.

In this SPDT switch device, however, there still exists a problem in that since the signal is passed through the source-drain capacitance $C_{off}$ obtained when the FET 13 is turned off, a leak current flows therethrough, with the result that an original loss of the transmission path is inevitably increased.

To overcome this problem, a parallel-resonance type switch device as shown in FIG. 8 has been proposed, which was already filed in Japanese Patent Office by the same Applicant (Japanese Published Unexamined Patent Application No. 9-23101). In this switch device, without providing the FETs 13 and 14 connected in parallel to the respective transmission path as with the case of the prior art SPDT switch device shown in FIG. 10, each of two inductors 21 and 22 is connected between the source electrode and the drain electrode of each of the FETs 11 and 12, respectively in such a way that a resonance circuit can be formed in cooperation with each of the off-state capacitances $C_{off}$ of both the FETs 11 and 12. In addition, a voltage supply terminal 6 for setting a reference voltage is connected to a junction point 8 of both the FETs 11 and 12 via a high resistance element 32, and further a control signal is applied to each of the gates of the FETs 11 and 12 via each of high resistance elements 31 and 33, respectively.

In the parallel resonance type switch device as shown in FIG. 8, since the inductance 21 or 22 and the off-state capacitance $c_{off}$ of the FET 11 or 12 construct a resonance circuit at a predetermined frequency band, respectively, it is possible to obtain a high-impedance transmission path, as far as both the FETs 11 and 12 connected in series to the transmission path are turned off. As a result, since the leak current flowing through the off-state capacitance can be reduced markedly in FIG. 10, the FETs 13 and 14 connected in parallel to the transmission path are not needed. In other words, since the FETs connected in parallel to the transmission path as with the case of the switch device as shown in FIG. 10 can be eliminated, it is possible to reduce the circuit loss and the number of circuit elements, while realizing a high isolation. In addition, in the case where the switch device is manufactured by a MMIC (Microwave Monolithic Integrated Circuit), if a dc-cutting capacitance is externally connected to the MMIC, since the same circuit construction of MMIC can be adopted in common, irrespective of the positive or negative supply voltage, it is possible to realize a general-purpose MMIC chip.

In the above-mentioned parallel resonance type switch device, however, when the resonance frequency is set to a PHS (Personal Hand-hone System) frequency, there still exists a problem in that the inductance used for the resonance circuit is relatively large. For instance, in the high frequency switch device shown in FIG. 8, when FETs each having a gate width of 1 mm are used, the off-state capacitance thereof is 0.4 pF. Therefore, when the resonance frequency is set to 1.9 GHz, the inductance value becomes as large as 21.5 nH.

FIG. 9 shows a layout pattern of the high frequency switch device shown in FIG. 8, in which a transmit-side terminal 3 of the transmit-side power transmission path is formed on the right side; and the receive-side terminal 4 of the receive-side small-signal transmission path is formed on the left side; the antenna terminal 2 is formed on the middle lower side; and the two gate signal input terminals 5 and 7 and the supply voltage terminal 6 are all formed on the middle upper side. The inductance 21 or 22 is a spiral inductor of 360 μm-square, in which each line width is designed as 10 μm and each space therebetween is designed as 5 μm. Further, the total chip area is 0.9 mm ×0.9 mm.

Further, in both the high frequency switch device as shown in FIG. 10 and the resonance type high frequency switch device as shown in FIG. 8, there exists such a problem that when a large signal is inputted, the inputted signal is distorted and thereby a linear output cannot be obtained. In more detail, in the case where a signal is inputted from the transmit-side terminal 3 and thereby the signal is transmitted from the antenna terminal 2 through the on-state FET 11, since the off-state FET 12 is to be turned on in ac signal standpoint, the signal waveform is deformed. As a result, noise radio waves including second and third higher harmonic spurious signals are generated, so that there exists a possibility that the system deteriorates.

In the PHS specifications decided by the RCR standard, the second higher harmonic spurious signal must be less than −45 dBc when the output power is 19 dBm. In the case of the resonance type high frequency switch device shown in FIG. 8, since the second higher harmonic spurious signal is −42 dBc, it is impossible to satisfy the RCR standard.

As described above, in the conventional resonance type high frequency switch device, when the resonance frequency is set to the L band, since an inductor of a relatively large inductance is needed, there exists a problem in that the layout area of the switch device increases. In addition, it has been necessary to secure linear output signals even when large signals are inputted.

SUMMARY OF THE INVENTION

With these problems in mind, therefore, it is the object of the present invention to provide a high frequency switch device, which can reduce the chip area by using a small inductor and further can improve the linearity of large signals, while making the best use of the features such as the low loss and high isolation of the parallel resonance type high frequency switch device.

To achieve the above-mentioned object, the present invention provides a high frequency switch device, comprising: first, second and third terminals; a first circuit composed of a first FET, and a first inductor and a first capacitor both connected with said first FET in parallel to each other, one end of said first circuit being connected to said first terminal; and a second circuit composed of a second FET, and a second inductor and a second capacitor both connected with the second FET in parallel to each other, one end of said second circuit being connected to said first circuit and the other end of said second circuit being connected to said second terminal, and wherein a first control signal is applied to a gate of the first FET via a resistance; a second control signal is applied to a gate of the second FET via a resistance; said third terminal (6) is connected to a common junction point of said first and second circuits; and a predetermined potential is applied to the common junction point.

Here, it is preferable that the high frequency switch device is used to switch radio signal paths when radio signals are given from a transmitter to an antenna or when radio signals are given from the antenna to a receiver; said first and second terminals are connected to the receiver and the transmitter, respectively; and said third terminal is connected to the antenna.

Further, it is preferable that the first and second capacitors are of linear element, respectively.

Further, it is preferable that the first and second capacitors are of parallel plane capacitance, respectively.

Further, it is preferable that the first inductor, a non-linear capacitance obtained when the first FET is turned off, and the first capacitor form a parallel resonance circuit; the second inductor, another non-linear capacitance obtained when the second FET is turned off, and the second capacitor form another parallel resonance circuit; and the first and second inductors are both so determined as to satisfy a predetermined parallel resonance condition at a predetermined frequency, respectively.

Further, it is preferable that the high frequency switch device is constructed on a single substrate as one chip; and the first and second capacitors are of metal-insulator-metal structure.

Further, it is preferable that the first FET is arranged between the first inductor and the first capacitor on a device chip; and the second FET is arranged between the second inductor and the second capacitor on the same device chip.

Further, the present invention provides a front end unit used at a radio frequency stage of a transceiver and having the same high frequency switch device as defined above.

Further, the present invention provides a transceiver having the same high frequency switch device as defined above.

DETAILED DESCRIPTION OF THE PREFERRED EMBODIMENTS

Figure 1:
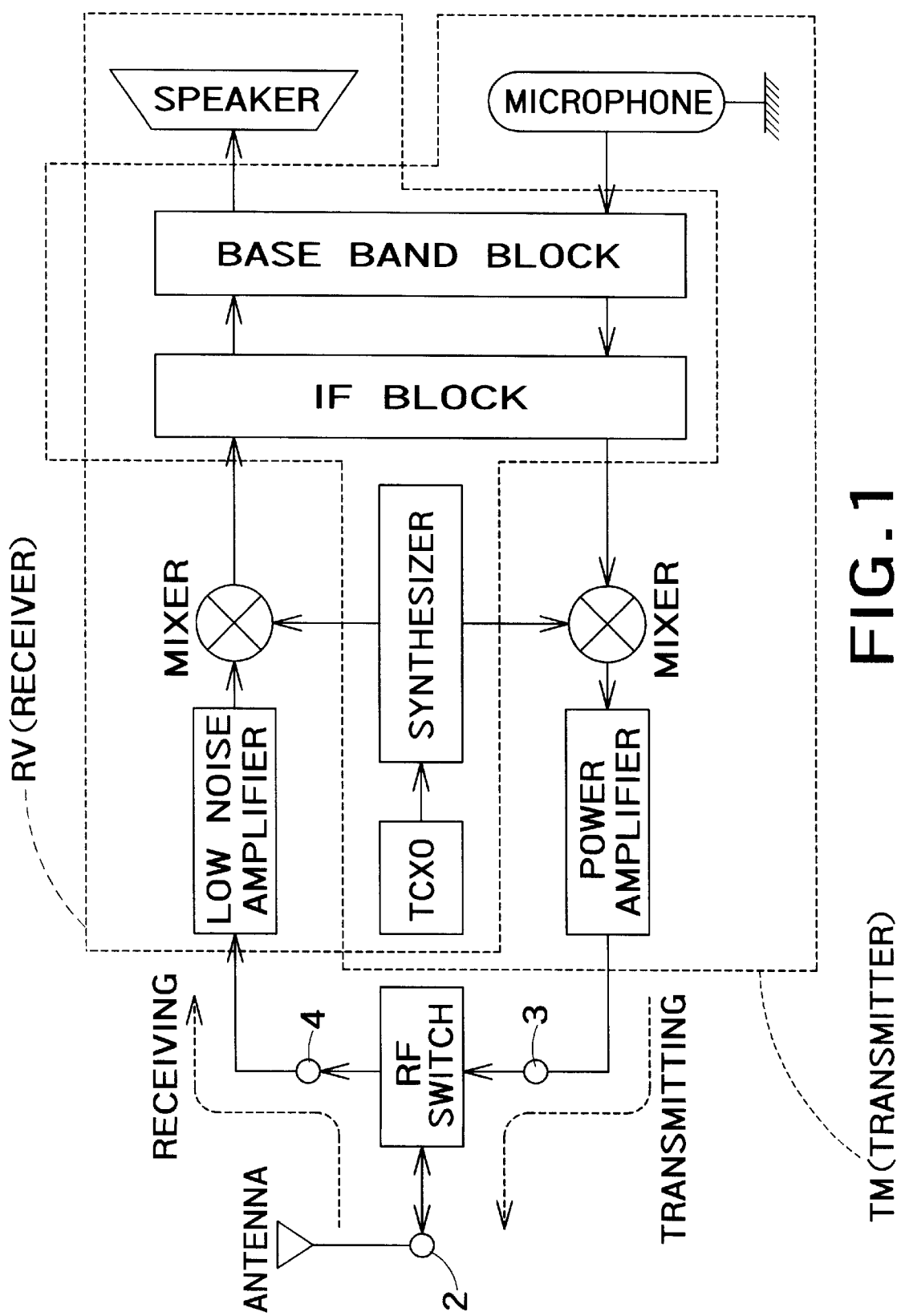
FIG. 1 is a whole block diagram showing a simple portable telephone system called PHS (Personal Handy-phone System), to which the RF switch device according to the present invention is applied.

FIG. 1 shows a simple portable telephone system called PHS (Personal Handy-phone System), to which the RF switch device according to the present invention is applied. Although not described in detail because the system is well known in the art, the RF switch device transmits signals received by an antenna to a low noise amplifier in reception mode, but transmits signals amplified by a power amplifier to the antenna in transmission mode, as understood with reference to FIG. 1.

Figure 2:
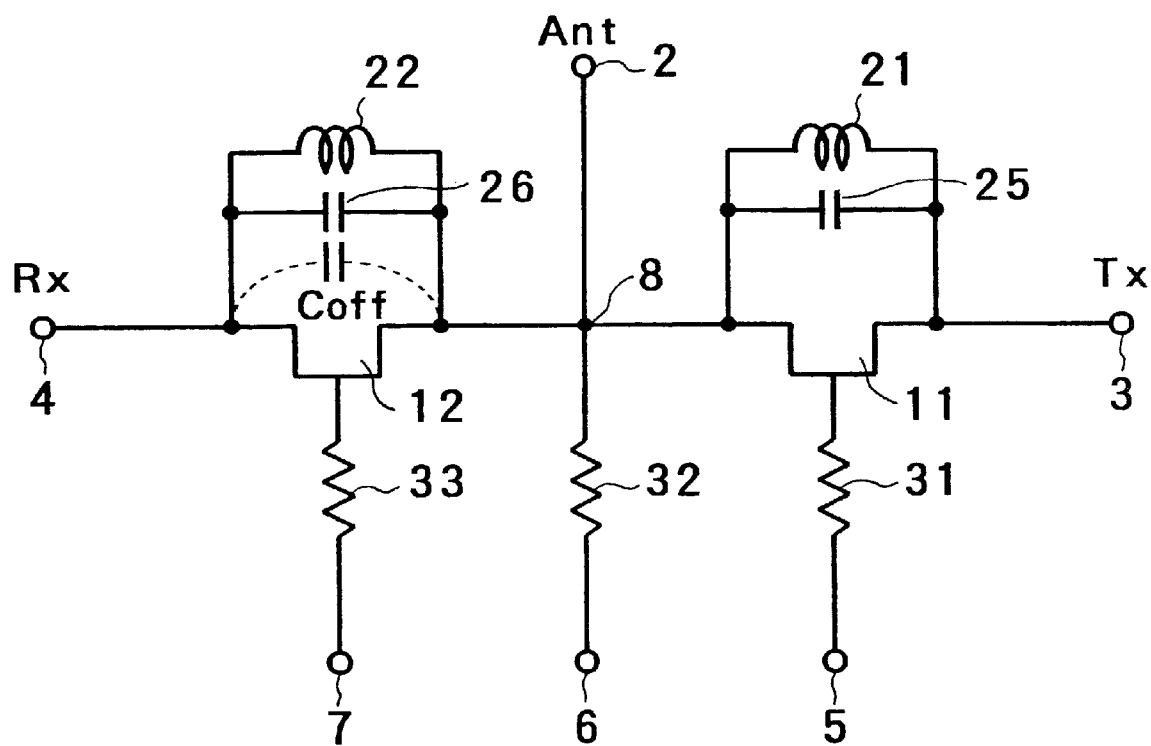
FIG. 2 is a circuit diagram showing one embodiment of the high frequency switch device according to the present invention.

FIG. 2 shows one embodiment of the high frequency switch device according to the present invention, which is used as an antenna switch for a digital cordless telephone. The switch device comprises a first filter circuit composed of a depletion type FET 11, an inductor 21 and a capacitor 25; a second filter circuit composed of a depletion type FET 12, an inductor 22 and a capacitor 26; and three resistors 31, 32 and 33. One end of the first filter and one end of the second filter circuits are connected in series with each other, and an antenna terminal (Ant) 2 is connected to a common junction point 8 of the two filter circuits. Further, a transmit-side terminal (Tx) 3 is connected to the other end of the first filter circuit, and a receive-side terminal (Rx) 4 is connected to the other end of the second filter circuit.

On the other hand, a gate signal input terminal 5 is connected to a gate of the FET 11 via the gate resistor 31 of high resistance value (e.g., several kΩ), and a gate signal input terminal 7 is connected to a gate of the FET 12 via the gate resistor 33 of high resistance value (e.g., several kΩ). Further, a reference potential input terminal 6 is connected to the common junction point 8 via the resistor 32 of high resistance value (e.g., several kΩ).

Further, the inductor 21 and the capacitor 25 are connected in parallel to each other between a drain electrode and a source electrode of the FET 11. In the same way, the inductor 22 and the capacitor 26 are connected in parallel to each other between a drain electrode and a source electrode of the FET 12.

The inductor 21 forms a parallel resonance circuit in cooperation with both an off-state capacitance of the FET 11 and the capacitor 25. Further, the inductance of the inductor 21 is so decided that the impedance of the parallel resonance circuit can be maximized at a frequency (e.g., 1.9 GHz) which is used by the digital cordless telephone. In the same way, the inductor 22 forms a parallel resonance circuit in cooperation with both an off-state capacitance of the FET 12 and the capacitor 26. Further, the inductance of the inductor 22 is so decided that the impedance of the parallel resonance circuit can be maximized at the frequency (e.g., 1.9 GHz).

The operation of the above-mentioned switch device according to the present invention will be described hereinbelow. In the transmission mode, for instance, 2.7 V is given to the gate signal input terminal 5; 0 V is given to the gate signal input terminal 7; and 2.7 V is given to the reference potential input terminal 6. Then, since the FET 11 is turned on and the FET 12 is turned off, when a signal is inputted to the transmit-side terminal (Tx) 3 under these conditions, the inputted signal is transmitted to the antenna terminal 2 through an on-resistance of the FET 11.

Here, the sizes of the elements are as follows: With respect to the FETs 11 and 12, the gate width thereof is $W_g=1$ mm, and the threshold voltage thereof is $V_{th}=-1.0$ V. Further, the two FETs 11 and 12 are of multi-finger type FET composed of FETs each having a unit gate width of 100 μm. Further, the line width of each inductor 21 or 22 is 10 μm; the space between the lines is 5 μm; and the film thickness is 3 μm. Further, the shape of the inductor is of square spiral type. Further, the off-state capacitance $C_{off}$ of each FET 11 or 12 is 0.4 pF.

Figure 8:
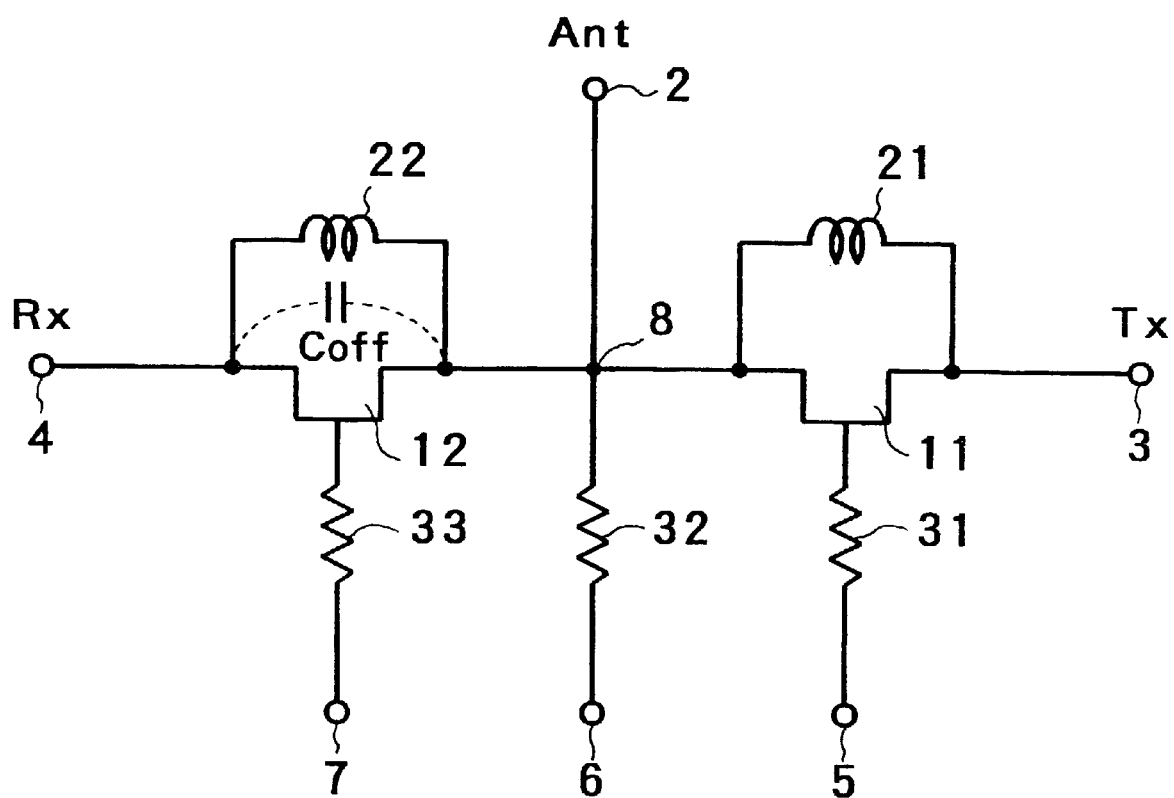
FIG. 8 is a circuit diagram showing a prior art resonance type high frequency switch device.
Figure 9:
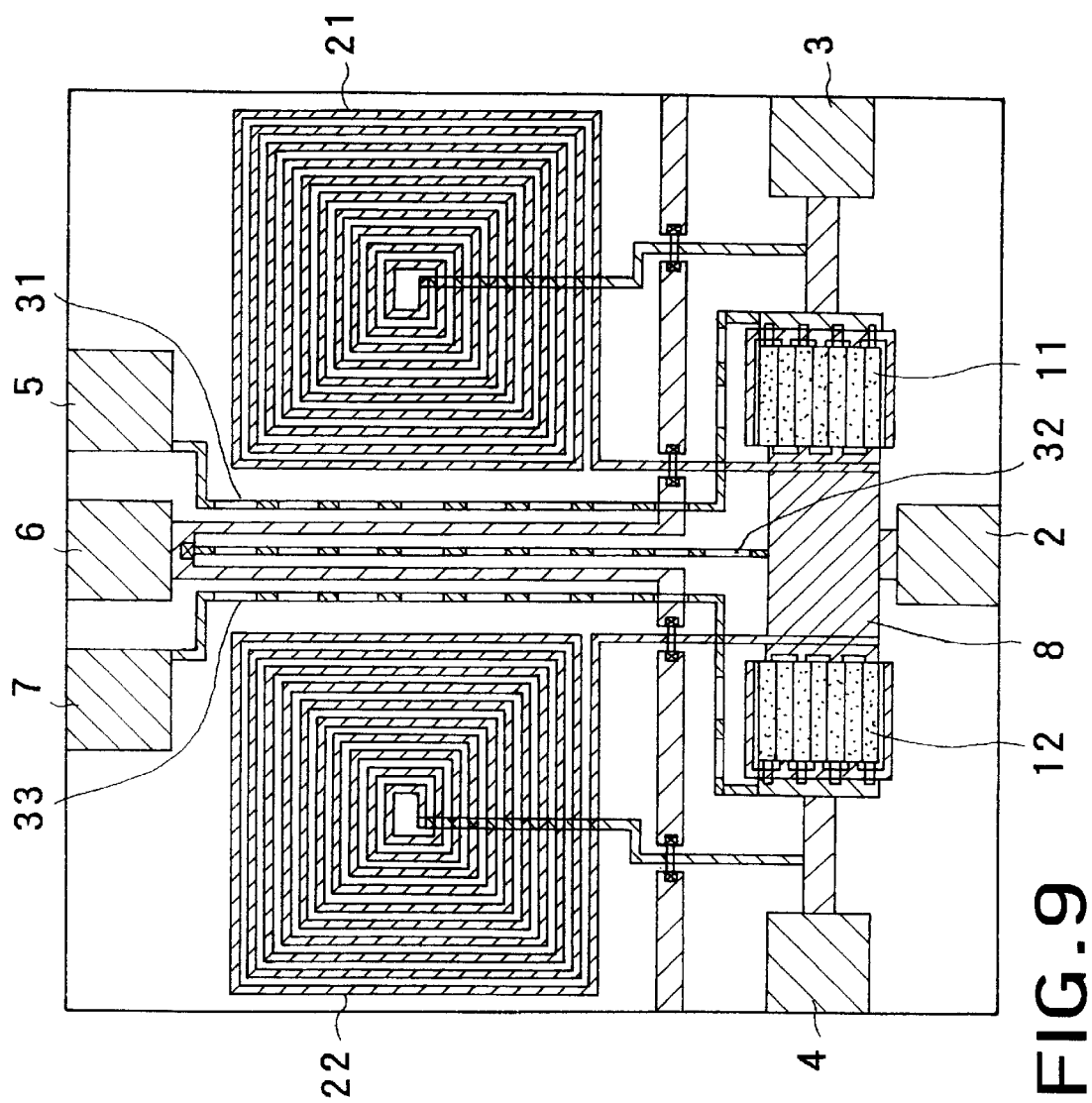
FIG. 9 is a view showing a layout pattern of the prior art high frequency switch device shown in FIG. 8.
Figure 10:
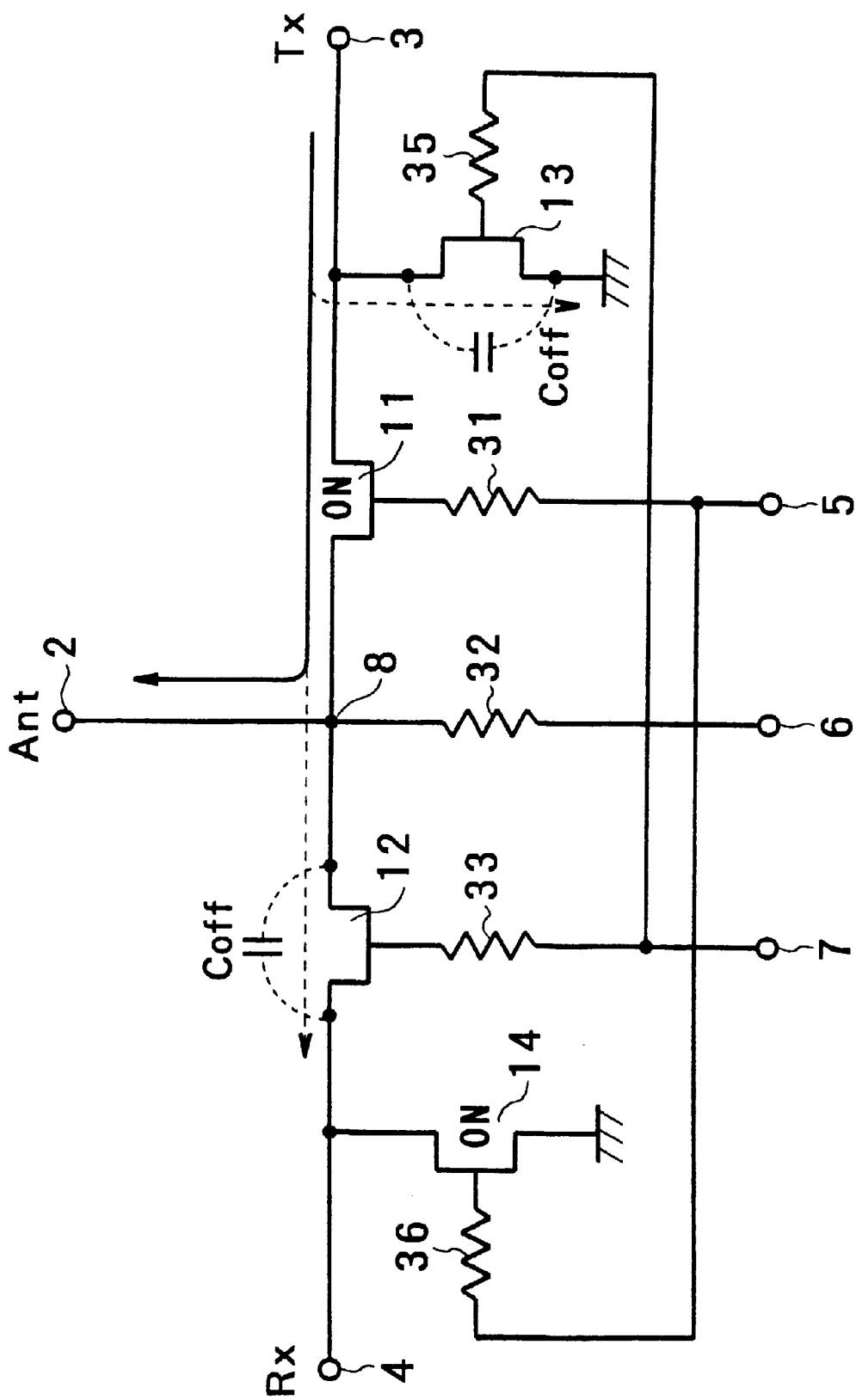
FIG. 10 is a view showing a layout pattern of a prior art non-resonance type high frequency switch device.

Under these conditions, when the capacitance $C_p$ of the capacitors 25 and 26 are decided as 0.4 pF and 0.8 pF, respectively, the inductance value is determined in such a way that the resonance frequency of the parallel resonance circuit is 1.9 GHz (the frequency used by the digital cordless telephone). The following table 1 lists two examples of the inductance values L determined as described above. Further, in the table 1 below, the prior art case (as shown in FIG. 8) where no capacitor is connected ($C_p=0$) is also listed for comparison of the inductance L between the prior art switch device and the switch device of the present invention.

TABLE 1

|  | $C_p$ | $C_{off}$ Wg = 1mm | $C_{rx}$ (=$C_p$+ $C_{off}$) | INDUCTANCE (L) |
| --- | --- | --- | --- | --- |
| PRIOR ART | 0(none) | 0.4pF | 0.4pF | 21.5nH |
| 1st EXAM. | 0.4pF | 0.4pF | 0.8pF | 10.5nH |
| 2nd EXAM. | 0.8pF | 0.4pF | 1.2pF | 6.0nH |

In the table above, the capacitance $C_{rx}$ is the total resonance capacitance obtained when the receive-side or the transmit-side is turned off, which is an addition of the capacitance $C_p$ of the capacitor 25 or 26 and the off-state capacitance $C_{off}$ obtained when the FET 11 or FET 12 is turned off. The above table indicates that the inductance can be determined small in comparison with that of the prior art case. This is because since the resonance frequency $f_o$ can be decided roughly as $(C_{rx} \cdot L)^{-\frac{1}{2}}$, when the capacitance $C_p$ is added to the off-state capacitance $C_{off}$ as with the case of the present embodiment, it is possible to set the inductance L to a smaller value.

Figure 4:
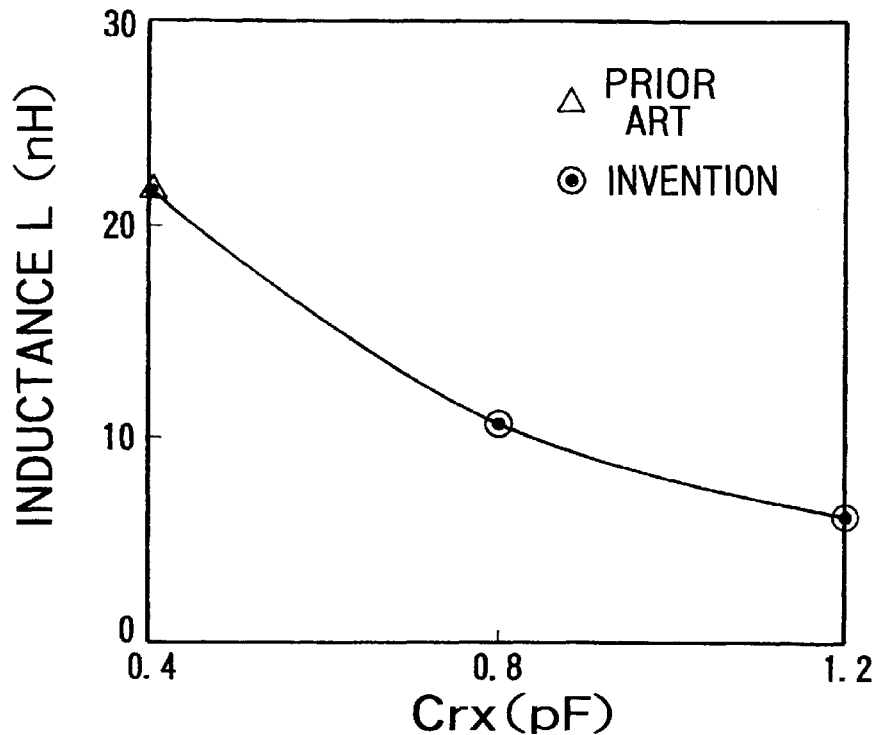
FIG. 4 is a graphical representation showing the relationship between the total resonance capacitance $C_{rx}$ (an addition of the capacitance element and the off-state capacitance of the FET) and the inductance L of the high frequency switch device shown in FIG. 2.

FIG. 4 shows the relationship between the total resonance capacitance $C_{rx}(=C_p+C_{off})$ and the inductance L, whose resonance circuit can realize the resonance frequency of 1.9 GHz. The case of $C_p=0$ (i.e., $C_{rx}=0.4$ pF) corresponds to the prior art high frequency switch device, and the case of $C_p>0$ (i.e., $C_{rx}>0.4$ pF) corresponds to the high frequency switch device according to the present embodiment. For example, in the case where $C_p$ is 0.8 pF (in the second example), it is possible to reduce the inductance L of the inductor 21 or 22 of the present embodiment less than ⅓(=6.0/21.5) of the inductance L of the prior art.

Figure 3:
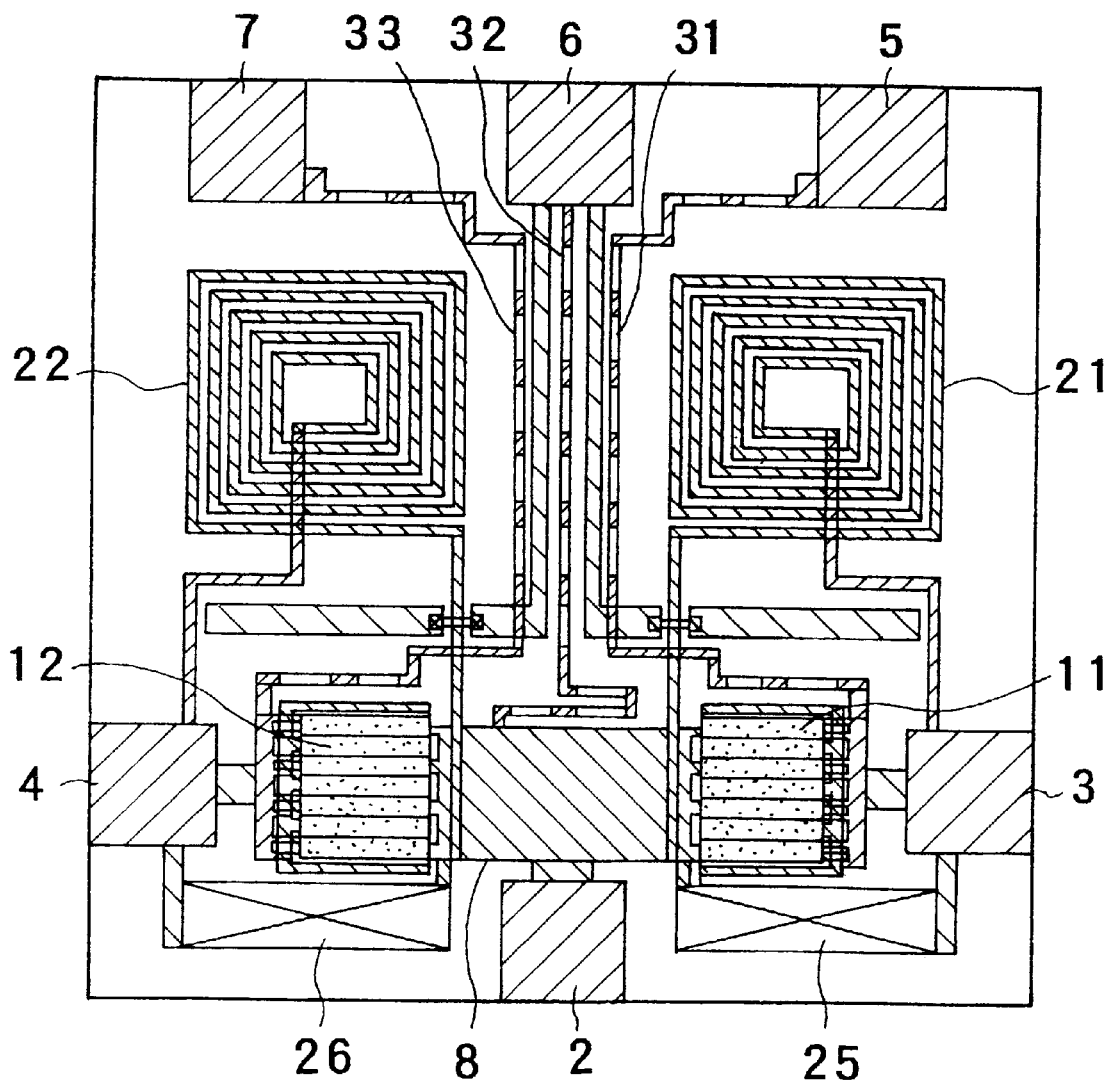
FIG. 3 is a view showing a layout pattern of the high frequency switch device shown in FIG. 2.

FIG. 3 shows a layout pattern of the high frequency switch device according to the present invention, in which the reference numerals correspond to those shown in FIG. 2. In FIG. 3, $C_p$ is 0.8 pF, and the inductor 21 or 22 is a 240 μm-square spiral inductor so designed that each line width is 10 μm and each space between the lines is 5 μm.

Further, in order to suppress the interference between the elements, the capacitors 25 and 26 are arranged at opposing positions to the inductors 21 and 22, respectively. Further, the two FETs 11 and 12 are arranged between the two inductors 21 and 22 and the two capacitors 25 and 26, respectively. In the present embodiment, although the capacitances 25 and 26 are added in comparison with the prior art switch device, since the areas occupied by the inductors 21 and 22 can be reduced markedly, as compared with that of the prior art switch device, it is possible to reduce the total chip area. In this connection, the chip size of this embodiment is 0.75 mm×0.75 mm; on the other hand, the chip size of the prior art is 0.9 mm×0.9 mm.

Here, the structure of the device shown in FIG. 3 will be described simply hereinbelow.

In the device shown in FIG. 3, elements as shown in FIG. 2 are formed on a GaAs substrate. Here, in FIG. 3, only the right-side circuit (from the node 3 to the node 8 in FIG. 2) will be explained. On the right side in FIG. 3, the transmit-side terminal 3 is shown, and a common junction point 8 is shown on the left side of the common junction point 8. The transmit-side terminal 3 is connected to the common junction point 8 via the inductor 21 and the capacitor 25 both connected in parallel to the FET 11, respectively. The inductor 21 is formed on a substrate Sub in square vortex shape. Further, the capacitance 25 is of MIM (metal-insulator-metal) structure. These MIM three-layers are overlapped with each other in the thickness direction of the capacitor 25. Further, the gate signal input terminal 5 is connected to the gate of the FET 11 via the resistance (wire) 31. On the other hand, the inductor 22, the capacitor 26, the FET 12, and the receive-side terminal 4 are all formed in the same way as with the case of the above-mentioned right-side structure.

As described above, in FIG. 3, since the capacitances 25 and 26 are of MIM structure, it is possible to realize low-distortion characteristics in switching operation. In more detail, as the capacitor to be connected in parallel to the inductor, since a capacitor of linear characteristics are preferable, the MIM capacitor is more suitable, as compared with the chip capacitor. This is because in the case of the MIM capacitor, since an element including a smaller parasitic capacitance can be realized, it is possible to obtain a linear operation of the resonance circuit.

In the high frequency switch device according to the present invention, it is possible to improve the linearity characteristics obtained when large signals are inputted, as described below.

Figure 5:
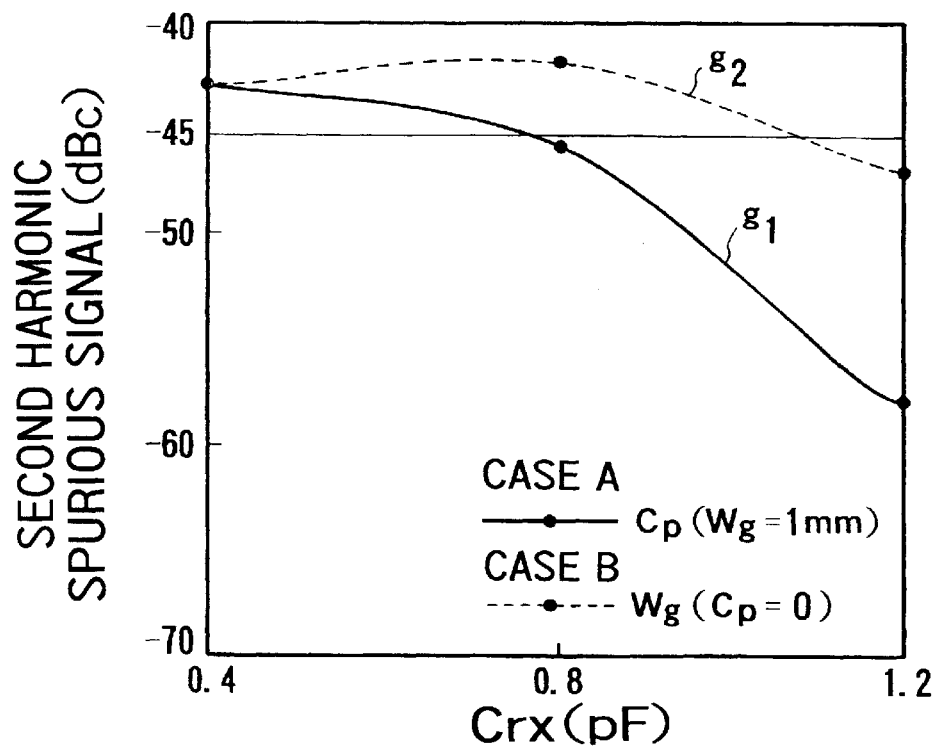
FIG. 5 is a graphical representation showing the relationship between the total resonance capacitance $C_{rx}$ and the second higher harmonic spurious signal of the high frequency switch device shown in FIG. 2.

FIG. 5 shows the relationship between the total resonance capacitance $C_{rx}$ and the second harmonic spurious signal transmitted from the antenna terminal 2 when the transmit input power is 20 dBm. In FIG. 5, the solid line denotes the case A in which the capacitance $C_p$ of 0 pF, 0.4 pF or 0.8 pF is added to the FET having a gate width $W_g$ of 1 mm as described above, and the dashed line denotes the case B in which the gate width $W_g$ is changed from 1 mm to 3 mm (from 0.4 pF to 1.2 pF), without connecting any additional capacitance $C_p$. Here, in the case of $C_{rx}$=0.4 pF, since $C_{off}$=0.4 pF and $C_p$=0, the second higher harmonic spurious signal is the same in both the cases of A and B. In both the cases A and B, the total resonance capacitance $C_{rx}$ changes from 0.4 pF to 1.2 pF when the receive-side is turned off.

A different point between the two cases A and B resides in that the total resonance capacitor $C_{rx}$ of the case A is composed of a capacitor $C_P$ (linear element) and the off-state capacitance $C_{off}$ (non-linear element) of the FET, but the total resonance capacitor $C_{rx}$ of the case B is only an off-state capacitance (non-linear element) of the FET. For instance, if $C_{rx}$=0.8 pF, in the case A, the proportion occupied by the capacitance $C_p$ (linear element) is 50% (=0.4/ 0.8); on the other hand, in the case B, the proportion occupied by the capacitance $C_p$ (linear element) is 0%. In these cases, the second higher spurious signal of the case A is as small as −46 dBc, in comparison with −42 dBc of the case B. This indicates that when the resonance capacitor includes the capacitance $C_p$ (linear element), the non-linear characteristics of the leak path in the transmission mode can be reduced and thereby the distortion can be reduced, in comparison with when the resonance capacitor is composed of only the off-state capacitance $C_{off}$ (non-linear element) of the FET.

As described, in the case of the prior art device where $C_p$=0, since the second higher harmonic spurious signal is −42 dBc at the output power of 19 dBm, the RCR standard cannot be satisfied. In the case of the switch device according to the present invention, where $C_p$=0.4 pF, since the second higher harmonic spurious signal is −46 dBc at the output power of 19 dBm, it is possible to satisfy the RCR standard.

In this case, however, when the total resonance capacitance $C_{rx}$ increases, since the inductance L includes a parasitic resistance r in practice, the impedance z of the resonance circuit decreases in accordance with the resonance impedance expression of $Z \sim L/(r \cdot C_{rx})$, with the result that the insertion loss and the isolation both deteriorate with increasing $C_p$.

Figure 6:
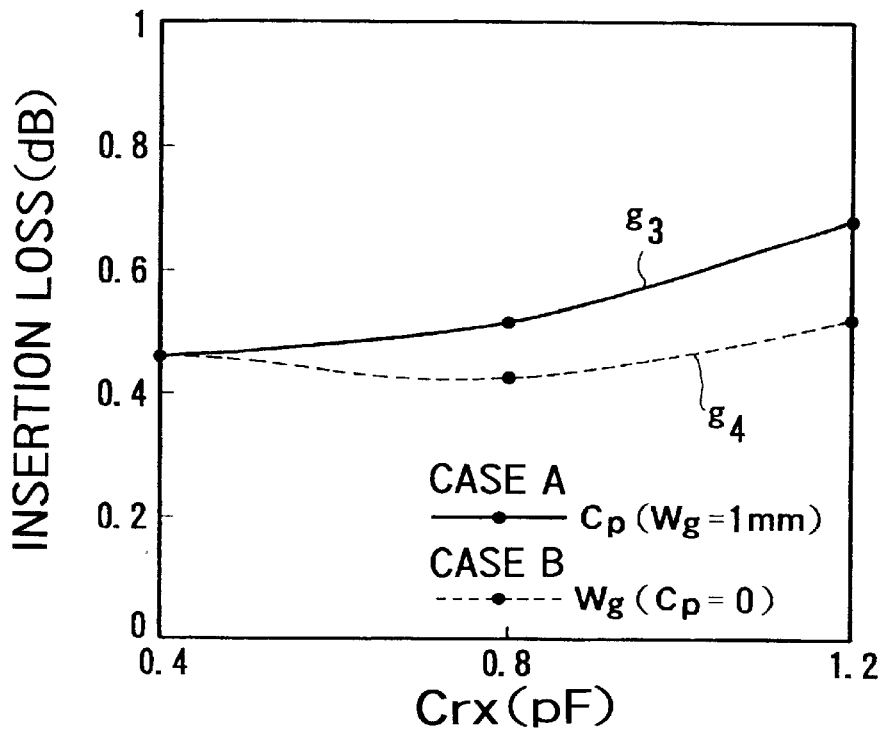
FIG. 6 is a graphical representation showing the relationship between the total resonance capacitance $C_{rx}$ and the insertion loss of the high frequency switch device shown in FIG. 2.
Figure 7:
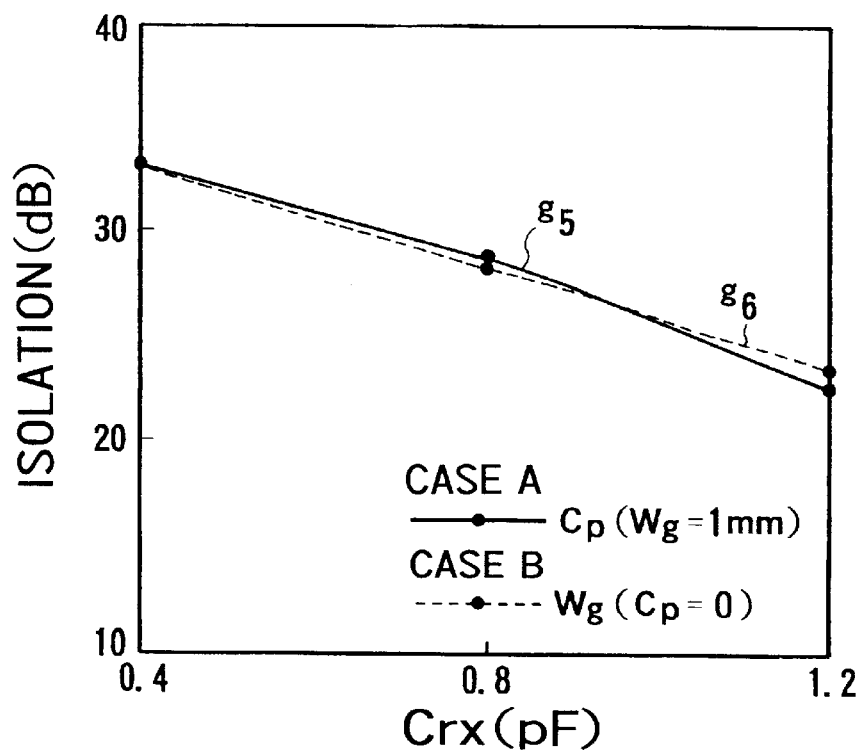
FIG. 7 is a graphical representation showing the relationship between the total resonance capacitance $C_{rx}$ and the isolation of the high frequency switch device shown in FIG. 2.

FIG. 6 shows the relationship between the insertion loss and the total resonance capacitance $C_{rx}$, and FIG. 7 shows the relationship between the isolation dB and the total resonance capacitance $C_{rx}$. With respect to the insertion loss, the on-resistance of the FET of the case B is small, as compared with the case A. However, when the layout area is taken into account, since the FET area is larger than the capacitor area, the layout area of the case B is larger than that of the case A. In the actual design, it is desirable to select the value of the capacitance $C_p$ under the consideration of the target specifications.

In the above-mentioned embodiment, although a dc voltage is supplied by use of high resistances in order to cutoff the RF signals, the same effect as above can be also obtained by use of inductors.

Further, in the above-mentioned embodiment, although the capacitors are arranged at opposing positions to the inductors, by arranging the FETs between the capacitors and the inductors, in order to suppress the interference between the elements, the present invention is not limited only to this element arrangement.

As described above, in the high frequency switch device according to the present invention, since the inductor and the capacitor are connected in parallel to each other between the drain and source electrodes of each FET; since a parallel resonance circuit is formed by use of an inductor and a capacitor in addition to an off-state capacitance of the FET; and further since the inductance is so designed that the impedance of the resonance circuit can be maximized at 1.9 GHz used by a digital cordless telephone, the resonance capacitance can be increased and thereby the inductance can be reduced to that extent, with the result that the chip area can be reduced markedly. In addition, since the resonance capacitance is composed of the linear capacitance (of the added capacitor) and the non-linear capacitance (of the off-state capacitance of the FET), it is possible to reduce the non-linear characteristics of the leak path in the transmission mode, so that the signal distortion can be reduced in the transmission mode.

What is claimed is:

1. A high frequency switch device, comprising:

first, second and third-terminals;

a first circuit composed of a first FET, and a first inductor and a first capacitor both connected with said first FET in parallel to each other, one end of said first circuit being connected to said first terminal; and a second circuit composed of a second FET, and a second inductor and a second capacitor both connected with the second FET in parallel to each other, one end of said second circuit being connected to said first circuit and the other end of said second circuit being connected to said second terminal, and wherein a first control signal is applied to a gate of the first FET via a resistance; a second control signal is applied to a gate of the second FET via a resistance; said third terminal is connected to a common junction point of said first and second circuits; and a predetermined potential is applied to the common junction point.

2. The high frequency switch device of claim 1, wherein the high frequency switch device is used to switch radio signal paths when radio signals are given from a transmitter to an antenna or when radio signals are given from the antenna to a receiver; said first and second terminals are connected to the receiver and the transmitter, respectively; and said third terminal is connected to the antenna.

3. The high frequency switch device of claim 1, wherein the first and second capacitors are of linear element, respectively.

4. The high frequency switch device of claim 1, wherein the first and second capacitors are of parallel plane capacitance, respectively.

5. The high frequency switch device of claim 4, wherein the first inductor, a non-linear capacitance obtained when the first FET is turned off, and the first capacitor form a parallel resonance circuit; the second inductor, another non-linear capacitance obtained when the second FET is turned off, and the second capacitor form another parallel resonance circuit; and the first and second inductors are both so determined as to satisfy a predetermined parallel resonance condition at a predetermined frequency, respectively.

6. The high frequency switch device of claim 4, wherein the high frequency switch device is constructed on a single substrate as one chip; and the first and second capacitors are of metal-insulator-metal structure.

7. The high frequency switch device of claim 6, wherein the first FET is arranged between the first inductor and the first capacitor on a device chip; and the second FET is arranged between the second inductor and the second capacitor on the same device chip.

8. A front end unit used at a radio frequency stage of a transceiver and having a high frequency switch device as a radio frequency switch, the high frequency switch device comprising:

first, second and third terminals;

a first circuit composed of a first FET, and a first inductor and a first capacitor both connected with said first FET in parallel to each other, one end of said first circuit being connected to said first terminal; and a second circuit composed of a second FET, and a second inductor and a second capacitor both connected with the second FET in parallel to each other, one end of said second circuit being connected to said first circuit and the other end of said second circuit being connected to said second terminal, and wherein a first control signal is applied to a gate of the first FET via a resistance; a second control signal is applied to a gate of the second FET via a resistance; said third terminal is connected to a common junction point of said first and second circuits; and a predetermined potential is applied to the common junction point.

9. The front end unit of claim 8, wherein the high frequency switch device is used to switch radio signal paths when radio signals are given from a transmitter to an antenna or when radio signals are given from the antenna to a receiver; said first and second terminals are connected to the receiver and the transmitter, respectively; and said third terminal is connected to the antenna.

10. The front end unit of claim 8, wherein the first and second capacitors are of linear element, respectively.

11. The front end unit of claim 10, wherein the first and second capacitors are of parallel plane capacitance, respectively.

12. The front end unit of claim 11, wherein the first inductor, a non-linear capacitance obtained when the first FET is turned off, and the first capacitor form a parallel resonance circuit; the second inductor, another non-linear capacitance obtained when the second FET is turned off, and the second capacitor form another parallel resonance circuit; and the first and second inductors are both so determined as to satisfy a predetermined parallel resonance condition at a predetermined frequency, respectively.

13. The front end unit of claim 11, wherein the high frequency switch device is constructed on a single substrate as one chip; and the first and second capacitors are of metal-insulator-metal structure.

14. The front end unit of claim 13, wherein the first FET is arranged between the first inductor and the first capacitor on a device chip; and the second FET is arranged between the second inductor and the second capacitor on the same device chip.

15. A transceiver having a high frequency switch device for switching radio signal paths when radio signals are given from a transmitter to an antenna or when radio signals are given from the antenna to a receiver, the high frequency switch device comprising:

first, second and third terminals connected to the transmitter, the receiver and the antenna, respectively;

a first circuit composed of a first FET, and a first inductor and a first capacitor both connected with said first FET in parallel to each other, one end of said first circuit being connected to said first terminal; and a second circuit composed of a second FET, and a second inductor and a second capacitor both connected with the second FET in parallel to each other, one end of said second circuit being connected to said first circuit and the other end of said second circuit being connected to said second terminal, and wherein a first control signal is applied to a gate of the first FET via a resistance; a second control signal is applied to a gate of the second FET via a resistance; said third terminal is connected to a common junction point of said first and second circuits; and a predetermined potential is applied to the common junction point.

16. The transceiver of claim 15, wherein the first and second capacitors are of linear element, respectively.

17. The transceiver of claim 16, wherein the first and second capacitors are of parallel plane capacitance, respectively.

18. The transceiver of claim 17, wherein the first inductor, a non-linear capacitance obtained when the first FET is turned off, and the first capacitor form a parallel resonance circuit; the second inductor, another non-linear capacitance obtained when the second FET is turned off, and the second capacitor form another parallel resonance circuit; and the first and second inductors are both so determined as to satisfy a predetermined parallel resonance condition at a predetermined frequency, respectively.

19. The transceiver of claim 17, wherein the high frequency switch device is constructed on a single substrate as one chip; and the first and second capacitors are of metal-insulator-metal structure.

20. The transceiver of claim 19, wherein the first FET is arranged between the first inductor and the first capacitor on a device chip; and the second FET is arranged between the second inductor and the second capacitor on the same device chip.

* * * * *

UNITED STATES PATENT AND TRADEMARK OFFICE
CERTIFICATE OF CORRECTION

PATENT NO. : 6,118,985
DATED : September 12, 2000
INVENTOR(S) : Katsue Kawakyu, Kawasaki; Masami Nagaoka, Ebina; Atsushi Kameyama, Ota-ku, all of Japan.

It is certified that error appears in the above-identified patent and that said Letters Patent is hereby corrected as shown below:

Column 8,
Line 33, "third-terminals" should read -- third terminals --.

Signed and Sealed this

Twenty-eighth Day of August, 2001

Attest:

*Nicholas P. Godici*

*Attesting Officer*

NICHOLAS P. GODICI
*Acting Director of the United States Patent and Trademark Office*